United States Patent [19]
Tseng

[11] Patent Number: 5,563,088
[45] Date of Patent: Oct. 8, 1996

[54] METHOD FOR FABRICATING A STACKED CAPACITOR IN A DRAM CELL

[75] Inventor: Horng-Huei Tseng, Hsinchu, Taiwan

[73] Assignee: Vanguard International Semiconductor Corporation, Hsin-Chu, Taiwan

[21] Appl. No.: 590,025

[22] Filed: Feb. 2, 1996

[51] Int. Cl.$^6$ .............................................. H01L 21/8242
[52] U.S. Cl. ................................ 437/52; 437/60; 437/919
[58] Field of Search ................................. 437/52, 60, 919

[56] References Cited

U.S. PATENT DOCUMENTS

| | | | |
|---|---|---|---|
| 5,104,821 | 4/1992 | Choi et al. ................................. | 437/52 |
| 5,508,223 | 4/1996 | Tseng ........................................ | 437/60 |
| 5,521,112 | 5/1996 | Tseng ........................................ | 437/52 |

*Primary Examiner*—John Niebling
*Assistant Examiner*—Richard A. Booth
*Attorney, Agent, or Firm*—George O. Saile; William J. Stoffel

[57] ABSTRACT

The present invention provides a method of manufacturing a capacitor for a DRAM which is characterized in that after forming a first conductive layer, an oxidation barrier layer (e.g., silicon nitride) and a polysilicon layer over associated field effect transistors, an opening is formed in the polysilicon layer over the contact node (e.g., source region) of the DRAM FET. The polysilicon layer is the oxidized thereby reducing the area of the opening below that of conventional photolithography limits. The oxidation barrier layer and the first conductive layer are anisotropically etched using the oxidized polysilicon layer as a mask. The polysilicon layer and oxidation barrier layer are then removed. Next, the first conductive layer is patterned into a bottom electrode. A dielectric layer and a top electrode are formed over the bottom electrode to complete the capacitor and DRAM of the present invention.

26 Claims, 6 Drawing Sheets

METHOD FOR FABRICATING A STACKED CAPACITOR IN A DRAM CELL

BACKGROUND OF THE INVENTION

1) Field of the Invention

This invention relates generally to fabrication of a capacitor in a DRAM cell and more particularly to a method for fabricating stacked capacitors with a large capacitance and a high density.

2) Description of the Prior Art

Very large scale integration (VLSI) semiconductor technologies have dramatically increased the circuit density on a chip. The miniaturized devices built in and on semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Workers in the art of aware of the challenges to produce small high capacitance DRAM capacitors. For example in U.S. Pat. No. 5,104,821 to Choi et al., a method is shown for forming a stacked capacitor having a bath tub shaped structure in which a bottom electrode is patterned from a first polysilicon layer using a first mask pattern. Next, a silicon nitride layer and a second polysilicon layer are formed over the bottom electrode. Then the silicon nitride layer and the second polysilicon layer are the etched using a second photo/etch step using a second masking pattern having a reverse phase of the first mask pattern. The second mask pattern must be aligned to the first mask pattern which adds overlay variation. The second polysilicon layer is oxidized forming an opening over the bottom electrode. Then the bottom electrode is etched through the opening to create a bathtub structure which has upwardly extended edges. The bathtub shaped bottom electrode is covered with a dielectric and top electrode to form a capacitor. However, this method can be improved to create an even smaller bottom electrode and provide better process control of the capacitance.

Also, many of the prior art methods require substantially more processing steps or/and planar structures which make the manufacturing process more complex and costly. There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields. There is also a challenge to develop a stacked capacitor which is not limited in size by the photolithographic resolution and alignment techniques.

SUMMARY OF THE INVENTION it is an object of the present invention to provide a method for fabricating a capacitor which can overcome the size limitations of photographic techniques, and has a high density and capacitance.

It is an object of the present invention to provide a method for fabricating a U-shaped capacitor having trench with a narrow consistent width, and providing a capacitor which has an overall width determined by the photolithographic limits, so that the capacitor occupies a minimum cell area.

It is an object of the present invention to provide a method for fabricating a DRAM having capacitor having a high density and capacitance which is low cost and simple to manufacture.

To accomplish the above objectives, the present invention provides a method of manufacturing a U-shaped capacitor for a DRAM which is characterized in that after forming a first conductive layer, an oxidation barrier layer (e.g., nitride) and a polysilicon layer are formed over associated field effect transistors (FETs), a first opening is formed in the polysilicon layer over the contact node (e.g., source region) of a DRAM FET. The polysilicon layer is oxidized thus forming an oxidized polysilicon layer. This oxidized polysilicon layer has about double the volume of the polysilicon layer and therefore can reduce the area of the first opening beyond that of conventional photolithography limits. The diameter of the first opening can be controlled by the thickness of the oxidized polysilicon layer. The oxidation barrier layer and the first conductive layer are anisotropically etched through the reduced second opening in the polysilicon layer to form the narrow center trench. The oxide/polysilicon layer is then removed. Next, the first conductive layer is patterned into a bottom electrode. A dielectric layer and a top electrode are formed over the bottom electrode to complete the capacitor and DRAM of the present invention.

The process of the instant invention provides a U-shaped capacitor having a narrow center trench that has a high capacitance. Because the invention forms the trench first and then patterns the bottom electrode, the invention provides improved process control of the size of the capacitor and of the capacitance. The process of forming the trench and patterning the bottom electrode are very controllable so that there is a minimum variation in capacitance. The process accurately and consistently forms a capacitor with a trench in the center with the smallest possible overall width (open dimensions). With the invention, narrowest dimension of the bottom electrode can be the smallest possible photolithographic resolution. The minimum dimension of the trench in the bottom electrode is less than the photolithographic resolution. Importantly, the invention improves the process control (consistency) of the minimum dimension compared to the prior art where the thickness of the bottom electrode is affected by the image tolerances of two masks and the overlay tolerances of the two masks. The width of trench of the invention is affected mainly the image tolerance of only one mask.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a DRAM having a stacked capacitor which has a small horizontal area, high capacitance and is simple to manufacture. The processes for forming the field oxide (FOX) and the field effect transistor structure as presently practiced in manufacturing DRAM cells are only briefly described in order to better understand the current invention. It should be understood by one skilled in the art that by including additional process step not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, method and capacitor of the current invention can be used in other chip types in addition to DRAM chips. Furthermore, the term "substrate" is meant to include devices formed therein and thereon the silicon substrate. The term "substrate surface" is meant to include the uppermost surface of the devices on the substrate surface and the top of the silicon substrate itself.

Figure 12:
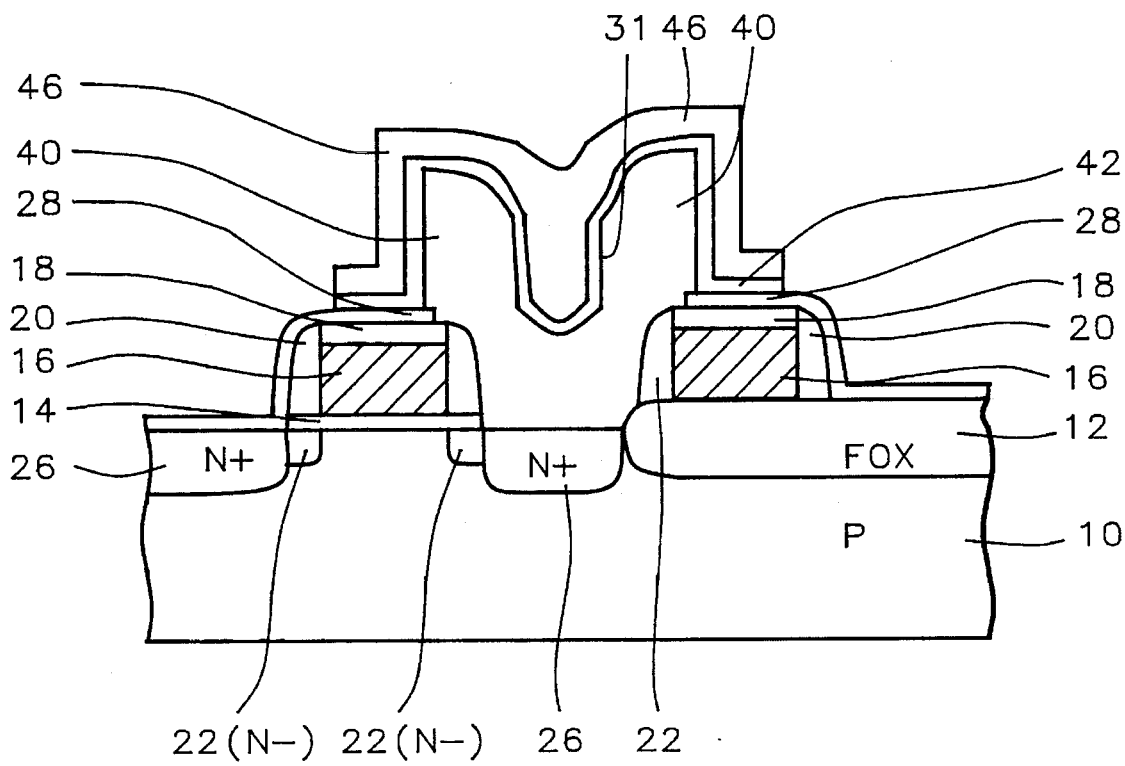

Referring to FIG. 12, there is shown a cross-sectional view of a DRAM cell having a U shaped capacitor, in which the DRAM Cell includes: a MOS (metal oxide semiconductor) device having source and drain regions 26, adjacent to a field oxide region 12, in a silicon substrate 10; a conductive word line 16 18 over the field oxide region 12 and a conformal silicon oxide layer 32. The bottom electrode 40 has U shaped structure preferably a width of the minimum photolithographic resolution. The trench 31 is narrower than the minimum photo resolution. This configuration allows a high capacitance per memory cell area with a minimum number of photo steps.

Figure 1:
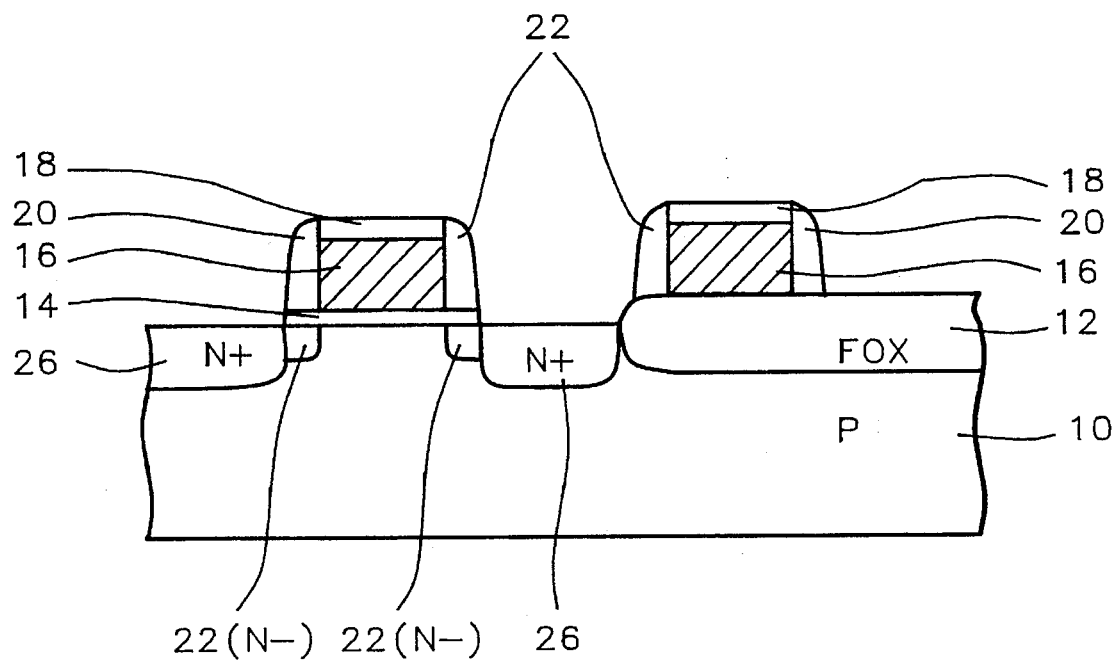
FIGS. 1 through 12 are cross sectional views for illustrating the method for manufacturing a DRAM having a U-shaped stacked capacitor with a center trench according to the present invention.

As shown in FIG. 1, the method of forming a U-shaped capacitor begins by fabricating having a field oxide layer 12 and FET devices on a substrate. Field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness is in the range of about 3500 and 5500 Å.

The semiconductor FET device is then formed in the active device area after removing the silicon nitride barrier layer and the pad oxide in a conventional wet etch. The most commonly used device for dynamic random access memory (DRAM) is MOSFET. This device is formed by first thermally oxidizing the active device area to form a thin gate oxide 14. The preferred thickness is from about 50 to 200 Å.

An appropriately doped polysilicon layer and an insulating layer are deposited on substrate. Conventional photolithographic techniques are used to pattern the polysilicon layer 16, and the insulating layer 18 which comprise the gate electrodes 14 16 18. As shown in FIG. 1, gate electrodes are formed over the field oxide layer 12 and are formed on the substrate disposed between a source 26 and a drain 26. The gate electrodes or word lines formed over the field oxide can electrically connect the MOSFET gate electrode to the appropriate peripheral circuit s on the DRAM chip. The distance between the inside gates 22 lacing the source is preferably between about 0.3 and 0.8 μm.

The lightly doped source drain 22 of the N-channel MOSFET is formed next, usually by implanting an N-type atomic species such as arsenic or phosphorus through the spaces between the gate electrodes 14 16 18. For example, a typical implant might consist of phosphorus P31 at a dose of between about 1E13 to 1 E14 atoms/cm$^2$ and at an energy between about 30 to 80 Kev.

After forming the lightly doped source/drain 14, sidewall spacers 20 are formed on the gate electrode 16 18 sidewalls. The sidewall spacers facing the source 26 are called inside sidewall spacers. These sidewall spacers 20 are formed by depositing a low temperature silicon oxide and anisotropically etching back to the silicon surface. For example, the silicon oxide could be formed with a chemical vapor deposition process using tetraethoxysilane (TEOS) at a temperature in the range of about 650° to 900° C. and the etch back pertbrined in a low pressure reactive ion etcher.

The source/drain regions 26 of the MOSFET are now implanted between the inside spacers 22 with a N type atomic species, for example, arsenic (As75), to complete the source/drain (node contact) 26. The implantation is usually done through a thin layer of silicon oxide of about 200 to 300 Å in thickness to minimize implant channeling and to protect against contamination by metals and other impurities. A typical implantation dose being between 2E15 to 1 E16 atoms/cm$^2$ and an energy of between about 20 to 70 Kev.

Figure 2:
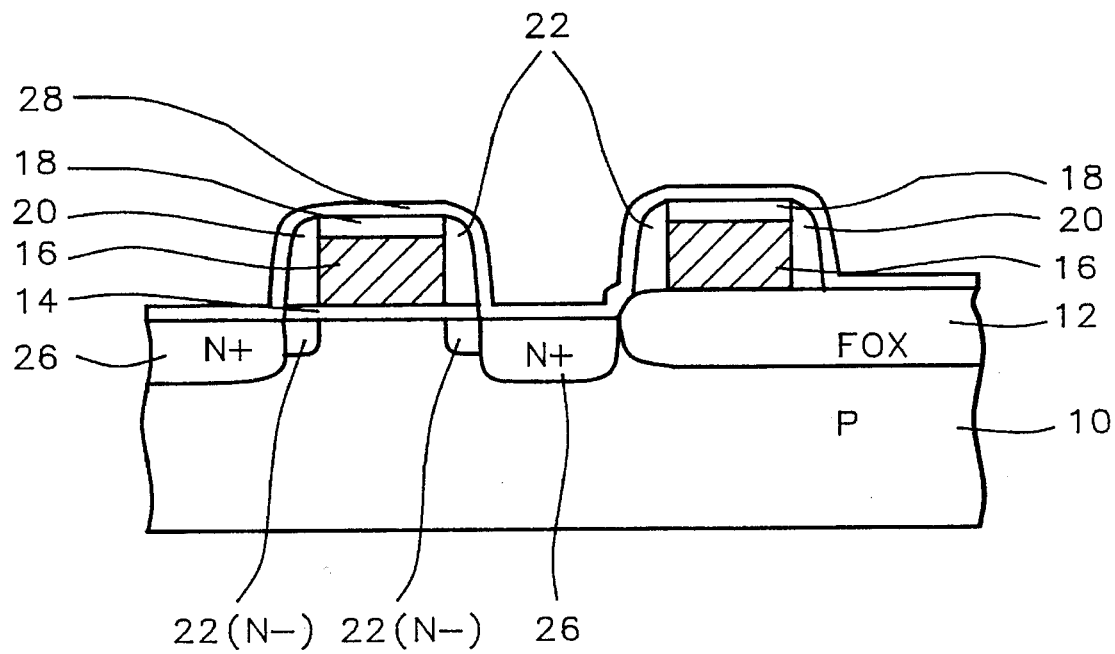

As shown in FIG. 2, a first conformal insulating layer 28 is formed over the substrate surface and contacts the source and drain areas 14 26. The conformal insulating layer 28 is preferably formed of silicon nitride or silicon oxide. The conformal insulating layer 28 is preferably composed of silicon oxide formed by a low temperature chemical vapor deposition process using tetraethylorthosilicate (TEOS). Layer 28 preferably has a thickness in the range between about 500 and 1500 Å and more preferably about 1000 Å.

Figure 3:
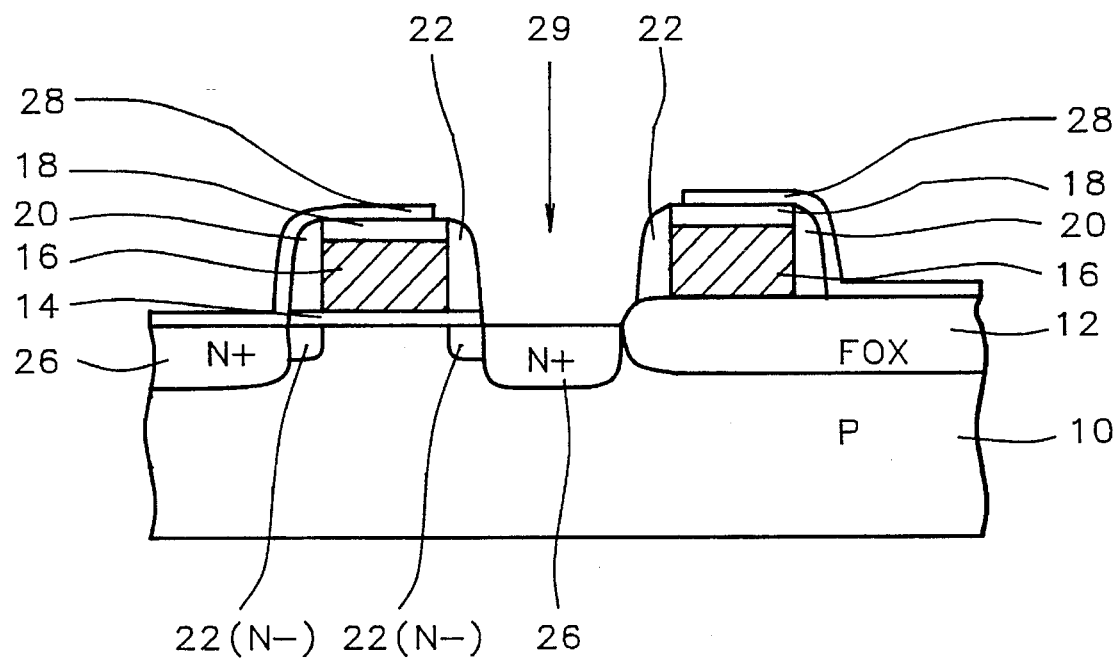

The remainder of this embodiment relates more specifically to those objects of the invention, which relate to the formation of the storage capacitor having a smaller size, an increased capacitance, and also providing a more manufacturable process. As shown in FIG. 3, a contact opening 29 is formed in the first insulation layer 28 to expose the source region 26 and the inside sidewalls 22 of the gate electrodes.

Figure 4:
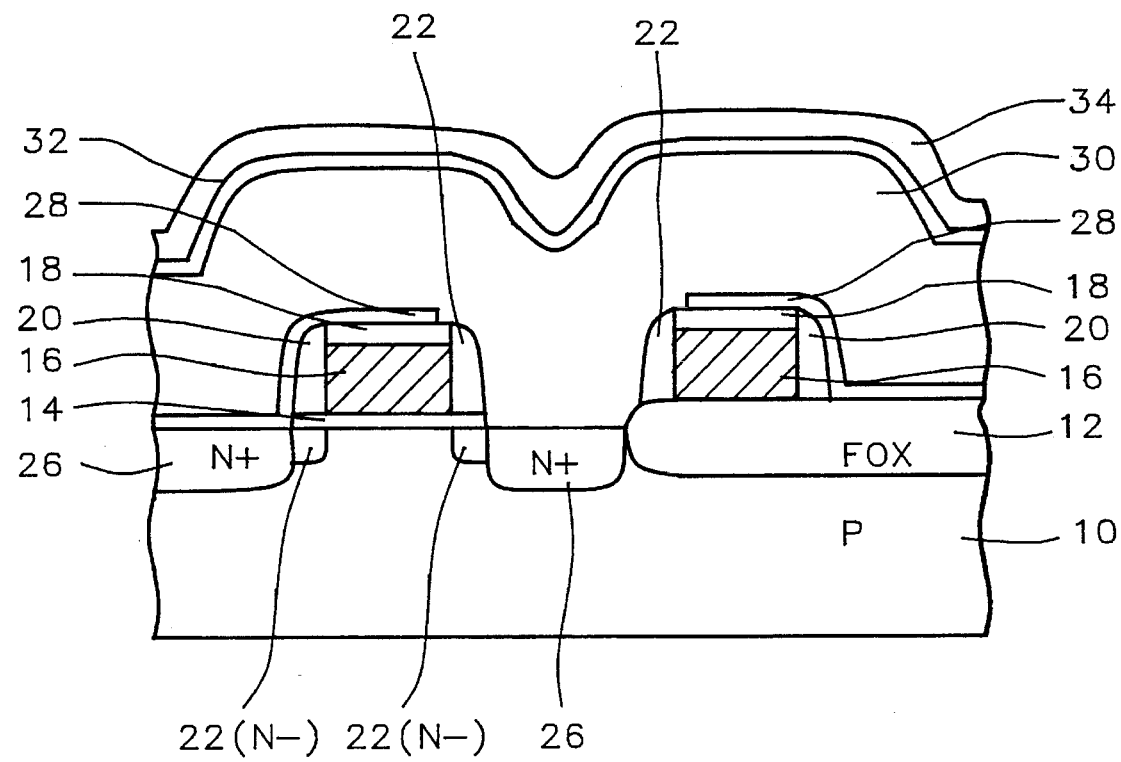

Now turning to FIG. 4, sequentially, a first conductive layer 30, an oxidation barrier layer 32 and a second conductive layer 34 are formed on the substrate surface. The first conductive layer 30 is formed over the first insulation layer 28, the inside sidewalls of the gate electrodes, and the node contact 26. The first conductive layer 30 is preferably formed of a doped polycrystalline silicon material. The first conductive layer is preferably composed of polysilicon formed using a LPCVD reactor at a process temperature of between about 550° and 650 ° C. The polysilicon layer 30 can be doped with a N-type impurity by ion implantation using, for example arsenic ions having an implant dose of between about 1E15 to 20E15 atoms/cm$^2$ and an ion energy of between about 20 and 80 Kev. Alternatively, the polysilicon layer 30 can be doped in situ during the polysilicon deposition. The first conductive layer 30 preferably has a thickness in the range between about 3000 and 8000 Å. The first conductive layer can have an impurity concentration in the range of between about 1E20 and 1E22 atoms/cm$^3$.

The oxidation barrier layer 32 inhibits oxidation of underlying layers and is preferably formed of silicon nitride. Preferably, the oxidation barrier layer is formed of silicon nitride having a thickness in the range of between about 300 and 1000 Å. A nitride oxidation barrier layer an be formed in a conventional chemical vapor deposition process, such as by reacting silane and ammonia at atmospheric pressure at 700° to 900° C., or by reacting dichlorosilane and ammonia at reduced pressure at approximately 700° C. Also, silicon nitride can be formed by plasma enhance chemical vapor deposition by reacting silane with ammonia or nitrogen in a glow discharge between 200° and 350° C.

As shown in FIG. 4, the second conductive layer 34 is formed over the oxidation barrier masking layer 32. The second conductive layer 34 is preferably formed of polycrystalline silicon having a thickness in the range of between about 500 and 1000 Å. Layer 34 can be doped or undoped.

Figure 5:
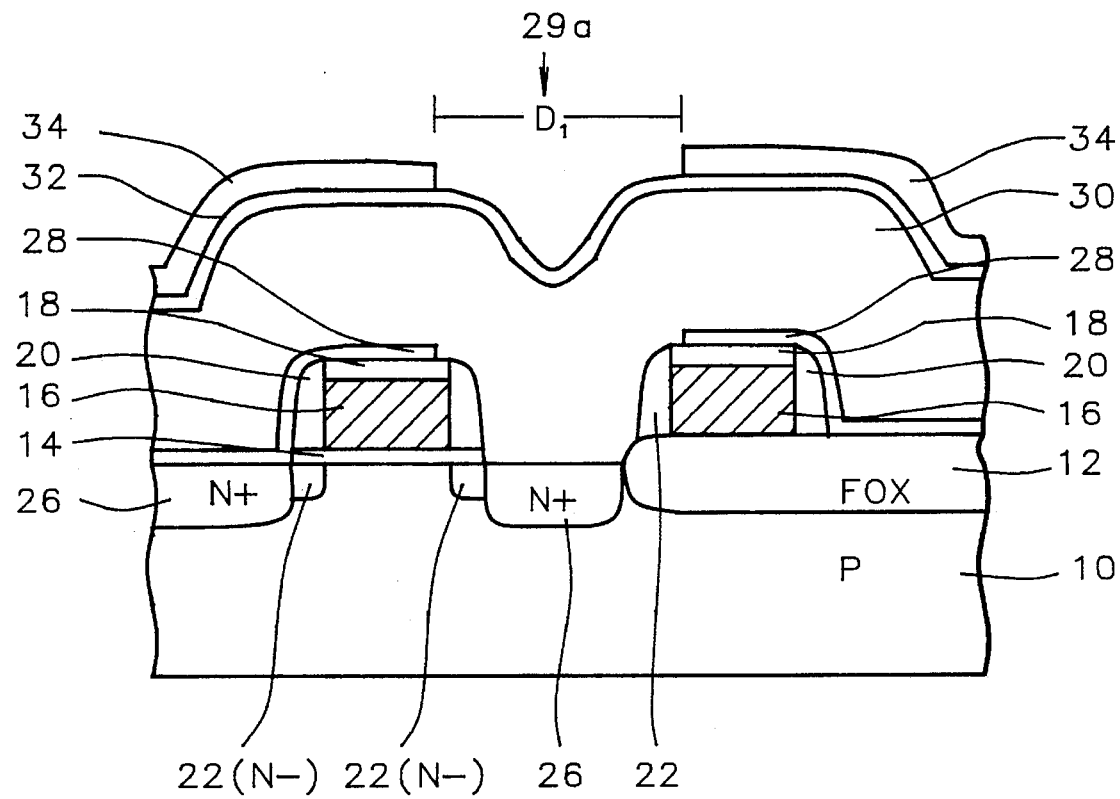

As FIG. 5 displays, a first opening 29A is formed through the second conductive layer 34 over the contact opening 29 or source. The second opening 29A has an open dimension D$_1$ (the minimum dimension or width such as shown in FIG. 5) preferably in the range of between about 0.4 and 0.6 µm. The second opening can have any shape such as a circle, rectangular or square shape. The first opening 29A can be the smallest dimension (e.g., width/diameter) formed by conventional photolithographic techniques.

Figure 6:
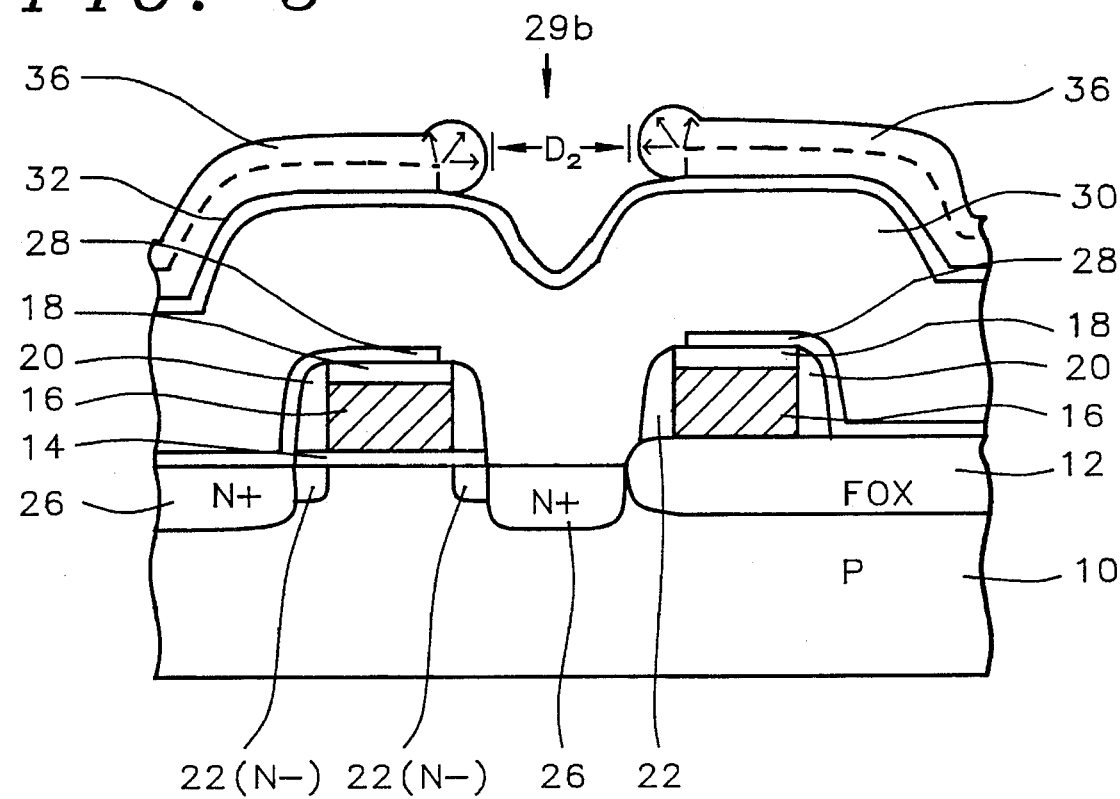

As shown in FIG. 6, the second conductive layer 34 disposed on an upper surface of the oxidation barrier layer 32 is oxidized thus forming a polysilicon/oxide layer 36 thus reducing the area of the first opening 29B (i.e., the smaller first opening). The oxidized second conductive layer can be composed of silicon oxide/polysilicon. Preferably, the layer 34 is entirely convened to SiO$_2$. After oxidizing the second conductive layer, the smaller first opening 29B in the oxidized second conductive layer has an open dimension preferably in the range between about 0.2 and 0.4 µm. The oxidation process approximately doubles the volume of the polysilicon. That is, for a 1000 Å thick polysilicon silicon layer, the corresponding oxidized polysilicon layer is about 2000 Å thick. The oxidized polysilicon layer grows in all directions approximately equally. Therefore as the oxidized polysilicon layer grows vertically, it also grows out horizontally as shown in FIG. 6.

The second conductive layer 34 can be oxidized in a diffusion furnace at a temperature between about 700° to 900° C. in an atmospheric pressure when the oxidation operation is carried out in a diffusion furnace. Also, the second conductive layer can be oxidized in a high pressure diffusion furnace for between about 25 to 35 minutes at a temperature of about 840° to 860° C. at a pressure of about between 750 to 770 torrs.

Figure 7:
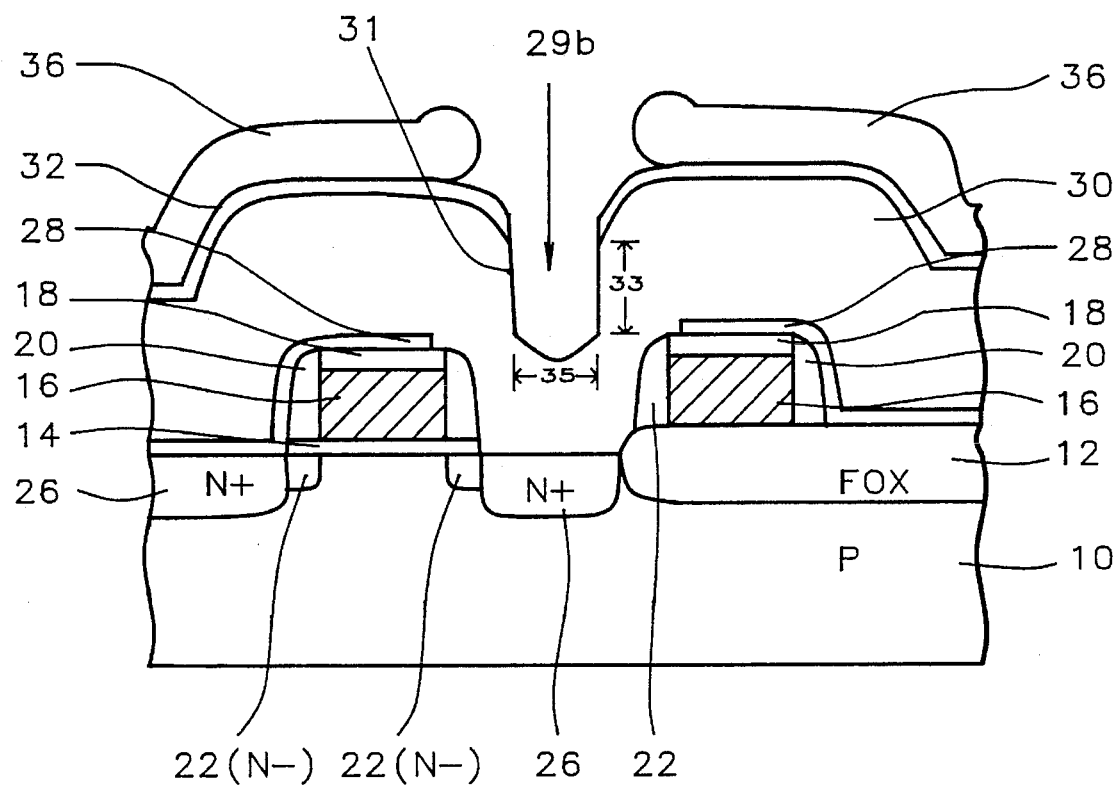

As shown in FIG. 7, a timed anisotropic etch is preferably used to etch completely through the oxidation barrier layer 32 and through an upper portion of the first conductive layer 30 by using the oxidized second conductive layer 36 as a mask. The etch forms a trench (hole) 31 in the first conductive layer 30. The anisotropic etch back of the oxidation barrier layer 32 and the upper portion of the first conductive layer 30 is preferably pertbrined using HBr/Cl$_2$ gas plasma.

The first conductive layer 30 preferably has a thickness in the range between about 3000 and 8000 Å. The trench 31 preferably has a depth 33 between about 2000 and 7000 Å. The trench 31 preferably has a width 35 in the range of between about 0.1 and 0.3 µm. The width of the trench can be very accurately controlled because the thickness of the second conductive layer is very controllable, the expansion of the oxidized second conductive layer 36 is constant, and the photo image dimensional control for only one mask is very controllable.

Figure 8:
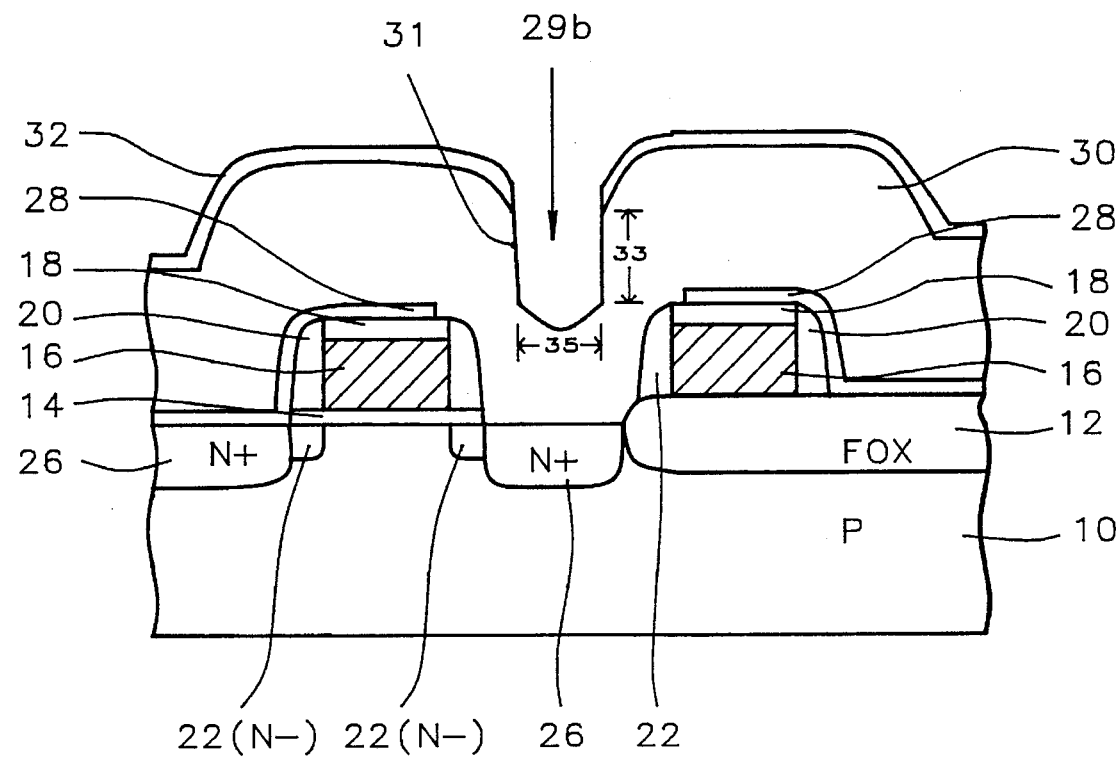
Figure 9:
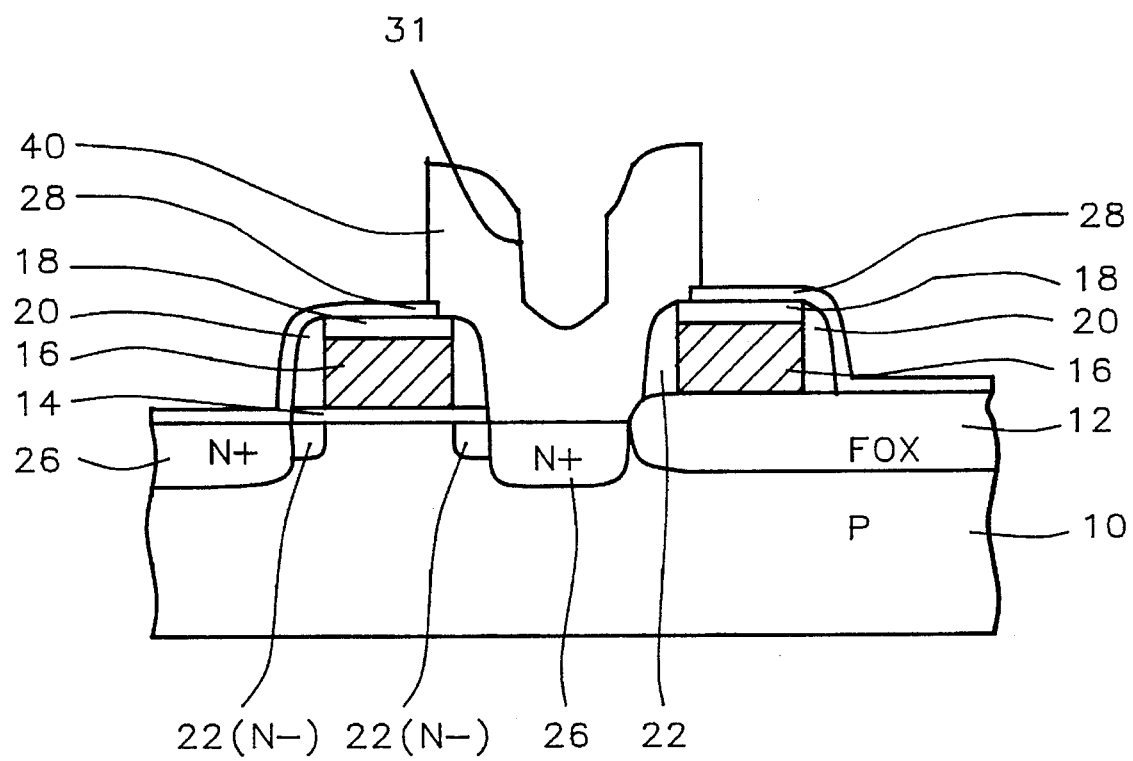

The oxidized second conductive layer 36 and the oxidation barrier layer 32 are then removed as shown in FIGS. 8 and 9. The oxidized second conductive layer 36 can be removed with a buffered HF etch. The oxidation barrier layer 32 can be removed with a phosphoric acid (H$_3$PO$_4$) etch.

As shown in FIG. 9, the first conductive layer is masked and etched to leave a portion of the first conductive layer 30 in contact with the source region thereby forming a bottom electrode 40. The width of the bottom electrode is can be the smallest width capable being formed by the photolithographic tool. The invention only uses one mask to form the trench which improves process control.

Figure 10:
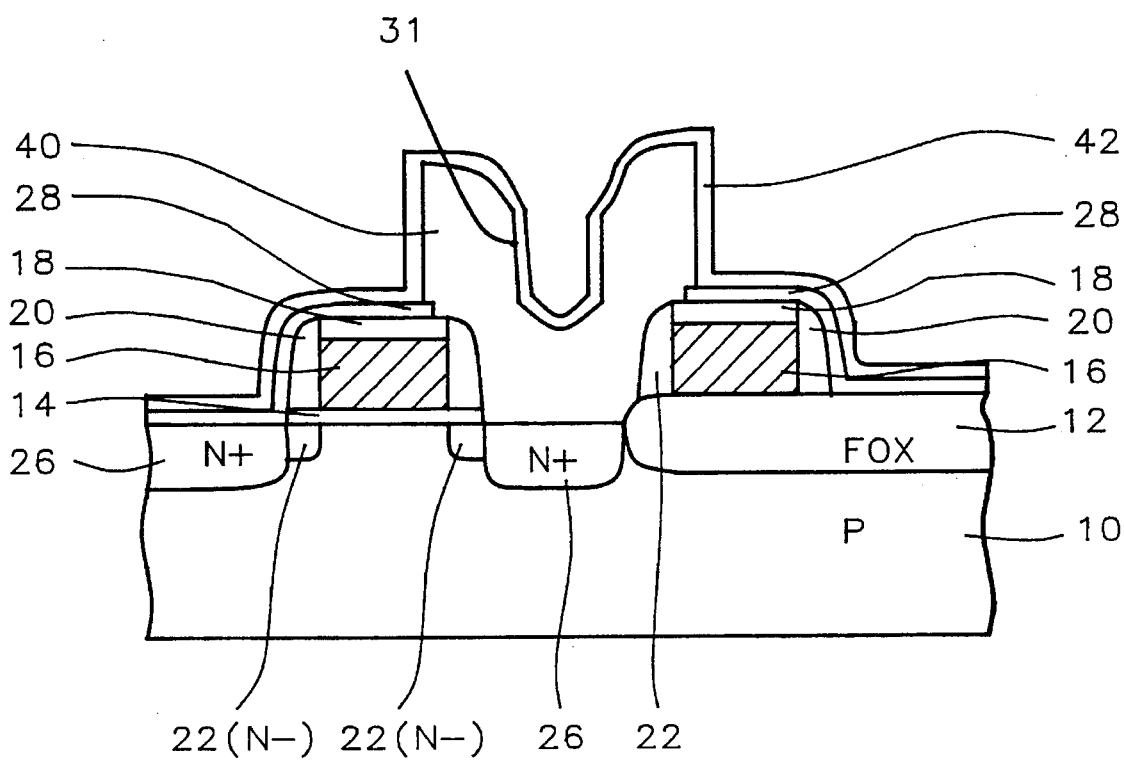

Next, a capacitor dielectric layer 42 is formed over the first electrode 40 as shown in FIG. 10. The material of the dielectric layer 42 can be any suitable material having a high dielectric constant and being continuous and pinhole free. The conformal dielectric layer 42 is preferably formed of silicon nitride, an oxide/nitride/oxide (ONO) film, tantalum pentoxide (Ta$_2$O$_5$) or silicon oxide material. The conformal dielectric layer 42 preferably has a thickness in the range between about 20 and 100 Å.

Figure 11:
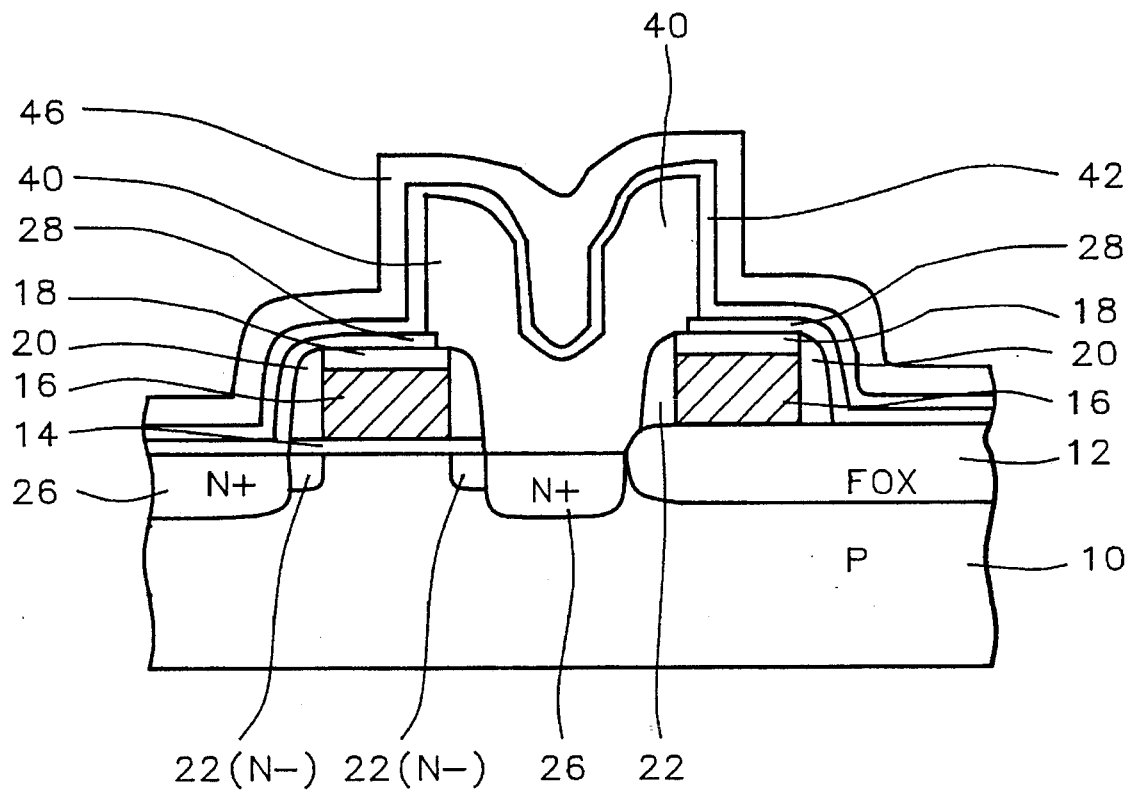

A top electrode 46 is formed over the dielectric layer 42 by the processes shown in FIGS. 11 and 12. This is accomplished by forming a third conductive layer 46 over the substrate surface as shown in FIG. 11. The third conductive layer is masked and etched, using conventional photolithographic techniques, to form the top plate electrode 46 as shown in FIG. 12. The top electrode 46 preferably has a thickness in the range between about 1000 and 2000 Å. The top plate electrode is preferably formed a polycrystalline silicon doped with an impurity. The top plate electrode/third conductive layer can have an impurity concentration in the range of between about 1E20 and 1E22 atoms/cm$^3$.

The process of the instant invention provides a U-shaped capacitor having a narrow center trench that has a high capacitance. The process of forming the trench and patterning the bottom electrode is very controllable so that there is a minimum variation in capacitance. The process accurately and consistently forms a capacitor with a trench in the center with the smallest possible overall width (open dimensions). With the invention, narrowest dimension of the bottom electrode is can be the smallest possible photolithographic resolution. The width of the trench in the bottom electrode is less than the photolithographic resolution. Importantly, the invention improves the process control (consistency) of the minimum dimension compared to the prior art where the thickness of the bottom electrode is affected by the thickness variation of the second conductive layer and by the image tolerance of two masks and the overlay tolerances of the two masks. The width of trench of the invention is affected mainly be the thickness control of the second conductive layer and the image tolerance of only one mask.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a capacitor on a substrate having a field oxide, a gate electrode, a source region, a drain region and an initial insulation layer, comprising the sequential processes of:
   a) forming sequentially a first conductive layer, an oxidation barrier layer and a second conductive layer over the substrate surface;
   b) forming a first opening through said second conductive layer over said source region;
   c) oxidizing said second conductive layer thus forming an oxidized second conductive layer thus reducing the area of said first opening to form a smaller first opening;
   d) etching anisotropically said oxidation barrier layer and through an upper portion of said first conductive layer by using said smaller first opening in said oxidized second conductive layer as a mask;
   e) removing said oxidized second conductive layer and said oxidation barrier layer;
   f) patterning said first conductive layer to form a bottom electrode in contact with said source region; and
   g) forming a dielectric layer over said bottom electrode and forming a top electrode over said dielectric layer thereby completing said capacitor.

2. The method of claim 1 wherein said first conductive layer and said top electrode are formed of polycrystalline silicon doped with conductive impurities in the range of between about 1E20 and 1E22 atoms/cm$^3$.

3. The method of claim 1 wherein said first conductive layer has a thickness between about 3000 and 8000 Å.

4. The method of claim 1 wherein said oxidation barrier layer is formed of silicon nitride and has a thickness between about 300 and 1000 Å.

5. The method of claim 1 wherein said second conductive layer has a thickness in the range between about 500 and 1000 Å.

6. The method of claim 1 wherein the oxidizing of said second conductive layer is performed in a diffusion furnace for between about 25 to 35 minutes at a temperature of about 840° to 860° C. at a pressure of about between 750 to 770 torr.

7. The method of claim 1 wherein said first opening has an open dimension in the range of between about 0.4 and 0.6 μm.

8. The method of claim 1 wherein said smaller first opening in said oxidized second conductive layer has an open dimension in the range between about 0.2 and 0.4 μm.

9. The method of claim 1, wherein said second conductive layer is oxidized in a diffusion furnace for a plurality of hours at a temperature between about 700° to 900° C. under atmospheric pressure.

10. The method of claim 1 wherein the oxidized second conductive layer is composed of silicon oxide having a thickness in the range of between about 600 and 2000 Å.

11. The method of claim 1 wherein said top electrode has a thickness in the range between about 1000 and 2000 Å.

12. The method of claim 1 wherein said dielectric layer is formed of a layer of silicon oxide, a layer of silicon nitride, and a layer of silicon oxide; and said dielectric layer has a total thickness in the range between about 20 and 100 Å.

13. A method of fabricating a capacitor on a substrate having a field oxide, a gate electrode, a source region, a drain region and an initial insulation layer, comprising the sequential processes of: p1 a) forming sequentially a first conductive layer composed of polysilicon, an oxidation barrier layer composed of silicon nitride, and a second conductive layer composed of polysilicon, over said initial insulation layer, and said first conductive layer contacting said source region;
   b) forming a first opening through said second conductive layer over said source region; said first opening having the smallest possible width capable using a photolithographic process;
   c) oxidizing said second conductive layer disposed on the upper surface of said oxidation barrier layer thus forming an oxidized second conductive layer thus reducing the area of said first opening forming a smaller first opening; said smaller first opening having an open dimension in the range of between about 0.2 and 0.4 μm;
   d) etching anisotropically said oxidation barrier layer and an upper portion of said first conductive layer by using said oxidized second conductive layer as a mask;
   e) removing said oxidized second conductive layer and said oxidation barrier layer;
   f) patterning said first conductive layer to form a bottom electrode in contact with said source region; and
   g) forming a dielectric layer over said first electrode and forming a top electrode over said dielectric layer thereby completing said capacitor.

14. The method of claim 13 wherein said first conductive layer and said top electrode are formed of polycrystalline silicon being doped with conductive impurities in the range of between about 1E20 and 1E22 atoms/cm$^3$.

15. The method of claim 13 wherein said first conductive layer has a thickness between about 3000 and 8000 Å.

16. The method of claim 13 wherein said oxidation barrier layer has a thickness between about 300 and 1000 Å.

17. The method of claim 13 wherein said second conductive layer has a thickness in the range between about 500 and 1000 Å.

18. The method of claim 13 wherein the oxidizing of said second conductive layer is performed in a diffusion furnace for between about 25 to 35 minutes at a temperature of about 840° to 860° C. at a pressure of about between 750 to 770 torr.

19. The method of claim 13 wherein said second conductive layer is oxidized in a diffusion furnace for a plurality of hours at a temperature between about 700° to 900° C. under atmospheric pressure.

20. The method of claim 13 wherein the oxidized second conductive layer is composed of silicon oxide having a thickness in the range of between about 600 and 2000 Å.

21. The method of claim 13 wherein said top electrode 46 has a thickness in the range between about 1000 and 2000 Å.

22. The method of claim 13 wherein said dielectric layer is formed of a layer of silicon oxide, a layer of silicon nitride, and a layer of silicon oxide; and said dielectric layer has a total thickness in the range between about 20 and 100 Å.

23. A method of fabricating dynamic random access memory (DRAM) having a capacitor, comprising the steps of:

a) forming a MOS (metal oxide semiconductor) device having source and drain regions, adjacent to a field oxide region, in a silicon substrate;

b) forming a conductive word line over said field oxide region;

c) forming a conformal silicon oxide layer over said MOS device;

d) etching a contact opening in said conformal silicon oxide layer to expose said source region;

e) forming sequentially a first conductive layer composed of polysilicon, an oxidation barrier layer composed of silicon nitride, and a second conductive layer composed of polysilicon over said conformal silicon oxide layer and said first conductive layer contacting said source region;

f) forming a first opening through said second conductive layer over said source region; said first opening having an open dimension in the range of between about 0.4 and 0.6 µm;

g) oxidizing said second conductive layer disposed on an upper surface of said oxidation barrier layer thus forming an oxidized second conductive layer thus reducing the area of said first opening forming a smaller first opening; said smaller first opening having an open dimension in the range of between about 0.2 and 0.4 µm.

h) etching anisotropically said oxidation barrier layer and an upper portion of said first conductive layer by using said oxidized second conductive layer as a mask;

i) removing said oxidized second conductive layer;

j) patterning said first conductive layer to form a bottom electrode in contact with said source region; and k) forming a dielectric layer over said first electrode and forming a top electrode over said dielectric layer thereby completing said capacitor.

24. The method of claim 23 wherein said first conductive layer has a thickness between about 3000 and 8000 Å and said second conductive layer has a thickness in the range between about 500 and 1000 Å.

25. The method of claim 23 wherein the oxidized second conductive layer is composed of silicon oxide having a thickness in the range of between about 600 and 2000 Å.

26. The method of claim 23 wherein said top electrode has a thickness in the range between about 1000 and 2000 Å.

* * * * *